(12) United States Patent  
Baldwin (10) Patent No.: US 10,514,214 B2
(45) Date of Patent: Dec. 24, 2019

(54) HEAT TRANSFER ASSEMBLIES (71) Applicant: GE Aviation Systems LTD, Cheltenham, Gloucestershire (GB)

(72) Inventor: Graham John Baldwin, Cheltenham (GB)

(73) Assignee: GE AVIATION SYSTEMS LIMITED, Cheltenham (GB)

( * ) Notice: Subject to any disclaimer, the term of this patent is extended or adjusted under 35 U.S.C. 154(b) by 0 days.

(21) Appl. No.: 15/509,910

(22) PCT Filed: Sep. 10, 2014

(86) PCT No.: PCT/GB2014/052740
§ 371 (c)(1),
(2) Date: Mar. 9, 2017

(87) PCT Pub. No.: WO2016/038321
PCT Pub. Date: Mar. 17, 2016

(65) Prior Publication Data
US 2017/0307308 A1  Oct. 26, 2017

(51) Int. Cl.
*F28F 7/00* (2006.01)
*F28F 13/00* (2006.01)
*H01L 23/373* (2006.01)
*H01L 23/467* (2006.01)

(52) U.S. Cl.
CPC ........ *F28F 13/003* (2013.01); *H01L 23/3733* (2013.01); *H01L 23/467* (2013.01); *H01L 2924/0002* (2013.01)

(58) Field of Classification Search
CPC .. F28F 13/003; H01L 23/3733; H01L 23/467; H01L 21/565; F28D 15/00; B01D 12/00
USPC ........................................... 165/185
See application file for complete search history.

(56) References Cited

U.S. PATENT DOCUMENTS

2002/0153327 A1* 10/2002 Lee ................ B01D 12/00
34/444
2003/0183907 A1* 10/2003 Hayashi ........... H01L 21/565
257/666
2009/0050299 A1   2/2009 Staley
(Continued)

FOREIGN PATENT DOCUMENTS

CN     203194082 U   9/2013
DE     102 44 805 A1  4/2004

OTHER PUBLICATIONS

"Developing further products and applications," Retrieved from the Internet URL: http://www.versarien.com/about-us/how-we-operate/, on Jul. 19, 2017, pp. 1-2.
(Continued)

*Primary Examiner* — Davis D Hwu
(74) *Attorney, Agent, or Firm* — McGarry Bair PC (57) ABSTRACT

A heat transfer assembly for transferring heat from a heat generating electrical element and having a porous element having a portion configured to contact the heat generating element and a moveable diaphragm having a portion adjacent the porous element and where the diaphragm is moveable between an extended position towards the porous element and a retracted position away from the porous element.

16 Claims, 10 Drawing Sheets

(56) References Cited

U.S. PATENT DOCUMENTS

2010/0065256 A1* 3/2010 Wilcoxon ............... F28D 15/00
                                                        165/104.31

OTHER PUBLICATIONS

Selection Guide: Piezo Actuators & Components, Linear Actuators & Motors, © Physik Instruments (PI) GmbH & Co. KG 2008, pp. 62-107.
International Search Report and Written Opinion issued in connection with corresponding PCT Application No. PCT/GB2014/052740 dated May 8, 2015.
International Preliminary Report on Patentability issued in connection with corresponding PCT Application No. PCT/GB2014/052740 dated Mar. 14, 2017.
GB Office Action dated Oct. 18, 2018.

* cited by examiner

HEAT TRANSFER ASSEMBLIES

BACKGROUND OF THE INVENTION

Contemporary high power dissipating electronic devices produce heat that may result in thermal management problems. Heat must be removed from the electronic device to improve reliability and prevent premature failure of the electronics. In many instances, heat generation is concentrated in a small number of key components. Heat exchangers or heat sinks may be employed to dissipate the heat generated by these components; however, the beneficial functions may be contrary to maintaining or reducing the size and weight of the system. Contemporary cooling methods may also require additional hardware to direct the passage of coolant and frequently require fans or pumps to propel the coolant, compromising reliability and requiring maintenance.

BRIEF DESCRIPTION OF THE INVENTION

In one aspect, an embodiment of the invention relates to a heat transfer assembly for use with a heat generating electrical element having a porous element having a portion in contact with the heat generating element, a diaphragm having a portion adjacent the porous element and where the diaphragm is moveable between an extended position towards the porous element and a retracted position away from the porous element, wherein the movement of the diaphragm away from the porous element draws cooling fluid into the porous element and movement of the diaphragm towards the porous element forces cooling fluid out of the porous element.

In another aspect, an embodiment of the invention relates to a heat transfer assembly for transferring heat from a heat generating electrical element having a porous element having a portion configured to contact the heat generating element, a diaphragm having a portion adjacent the porous element and where the diaphragm is moveable between an extended position towards the porous element and a retracted position away from the porous element, a piezoelectric actuator provided on the diaphragm to move the diaphragm between extended and retracted positions wherein the movement of the diaphragm away from the porous element draws cooling fluid into the porous element and movement of the diaphragm towards the porous element forces cooling fluid out of the porous element.

DETAILED DESCRIPTION OF EMBODIMENTS OF THE INVENTION

Figure 1:
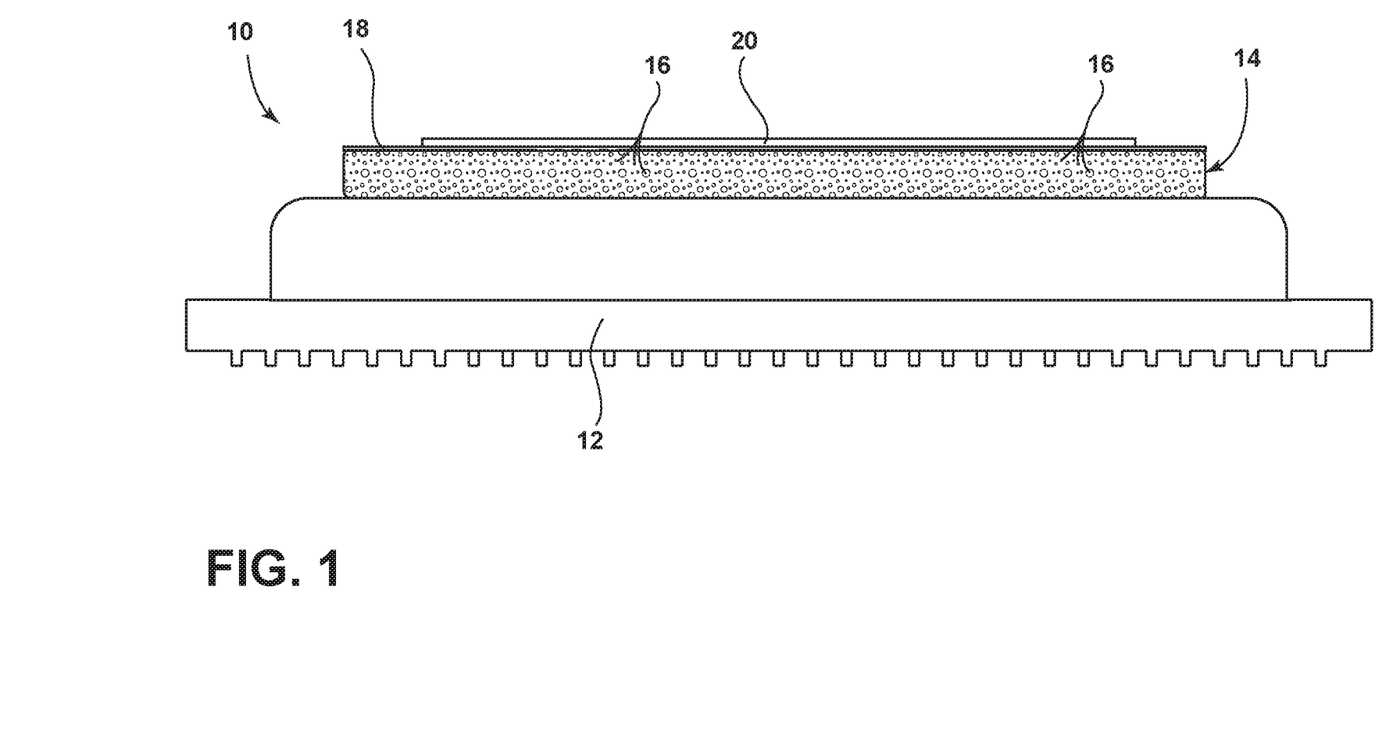
FIG. 1 is a perspective view of a heat transfer assembly per an embodiment of the invention.

FIG. 1 illustrates a heat transfer assembly 10, which may include a heat generating electrical element 12 or may be used to transfer heat from a heat generating electrical element 12. The heat generating electrical element 12 may be any electronic heat dissipating component that requires thermal management such as a microprocessor, MOSFET, displays, etc. The heat transfer assembly 10 may be used with airborne, shipboard, and ground based electronics.

A porous element 14 may be included in the heat transfer assembly 10 and may have a portion in contact with the heat generating element 12. In the illustrated example, the porous element has a lower surface that is in contact with the heat generating element 12. The porous element 14 may be mounted on the heat generating electrical element 12. In such an instance the porous element 14 may be mounted in any suitable manner including that a thermal conductive adhesive may be used to couple the porous element 14 to the heat generating electrical device 12. The use of such a thermally conductive compound may minimize any thermal stresses that would be created as compared to other means of fastening. By way of non-limiting examples, the heat transfer assembly 10 may be mounted to the heat generating element 12 with thermally conductive adhesive, braising, soldering or external mechanical clamp mechanism with or without a thermally conductive interface material.

The porous element 14 may act as a heat exchanger and may be formed in any suitable manner including that it may be shaped as a thin pad or ring. Any suitable thermally conductive material may be used including one of several forms of porous metal. For example, porous sintered copper, porous aluminum, or a copper sponge may be used. The density of the porous element 14 including the number and size of the pores 16 in the porous element 14 may be adjustable and may be varied within the porous element 14. The pores 16 may interconnect with each other to form passages within the porous element 14. It is contemplated that the porous element 14 may generally include a low-density material. For example, the porous element 14 may have up to 1 mm diameter pores 16 and 85% porosity (i.e. the volume of open area as a percentage of the total volume) to accommodate airflow. Alternatively, it may be beneficial to increase the density and thereby conductive heat flow in some areas or the entirety of the porous element 14. By way of non-limiting examples, porosity in the region of 50-60% and a pore size of around 500 11 m are envisaged to suit the performance of the described piezoelectric diaphragm arrangements. The porous element 14 may be sized to suit the component to be cooled. While pores 16 of the porous element 14 have been shown as having different sizes, it is contemplated that the pores 16 may be formed of a consistent size. Further, the pores 16 may be spaced from each other in any suitable manner.

A diaphragm 18 may also be included in the heat transfer assembly 10 and may have a portion adjacent the porous element 14. In the illustrated example, the diaphragm 18 covers the entire upper surface of the porous element 14, although this need not be the case. The diaphragm 18 may be moveable between an extended position towards the porous element 14 and a retracted position away from the porous element 14. For example, a piezoelectric actuator 20 may be provided on the diaphragm 18 to move the diaphragm 18 between the extended and retracted positions. The piezoelectric actuator 20 may be for example a piezoelectric crystal, which is located on the diaphragm 18. The diaphragm design may utilize linear or radial oscillation to achieve air movement within the pores of the porous element 14. The diaphragm 18 may be formed from any suitable flexible material including plastic, composite, or metal including aluminum, copper, stainless steel, etc. The diaphragm 18 and the porous element 14 may be sized such that the porous element 14 has a proportion of area covered by the diaphragm 18 that is significantly greater than the area available to inhale and exhale the coolant (i.e. air). This exemplary thin pad or ring of the porous element 14 may provide a suitable proportion.

In the illustrated example, the piezoelectric actuator 20 is provided on an upper surface of the diaphragm 18 at the center of the diaphragm 18. While the piezoelectric actuator 20 may be located elsewhere, locating it at the center of the diaphragm 18 is believed to increase the deflection of the diaphragm 18. The piezoelectric actuator 20 may be operably coupled to a suitable power source through any suitable connection (not shown).

During operation, the porous element 14 conducts heat away from the heat generating electrical device 12 and into the pores 16. The piezoelectric actuator 20 is actuated and this results in movement of the diaphragm 18 to draw air in to the porous element 14 and push out the drawn in air. More specifically, when a voltage is applied to the piezoelectric actuator 20, movement of the diaphragm 18 away from the porous element 14 draws cooling fluid into the porous element 14. When a voltage of opposite polarity is applied to the piezoelectric actuator 20, movement of the diaphragm 14 towards the porous element forces cooling fluid out of the porous element 14. The cooling fluid may be any suitable cooling fluid including air in the environment of the heat transfer assembly 10. The motion of the diaphragm 18 creates an alternating flow of air and the air moving through the porous element 14 exchanges conducted heat to the coolant (i.e. air) by forced convection and air movement in and out of the porous element assists an exchange of heat to the environment by convection.

The arrangement of the porous element 14, diaphragm 18, and piezoelectric actuator 20 is such that when the diaphragm 18 is made to extend and retract by the piezoelectric actuator 20 it may resonate such that small volumes of air are alternately drawn in and then expelled via the pores 16 in the open edges of the porous element 14. The ratio of diaphragm-covered area to the exposed periphery of the porous element 14 may be designed to have sufficient air movement through the porous element 14. The geometry of air paths exiting the porous element 14 may be configured to generate turbulence in the expelled air, enhancing dispersal into the surrounding airflow regardless of whether such airflow is natural or assisted. In this manner, heat may be extracted from an electronic device and dispersed to the surrounding environment.

Figure 2A:
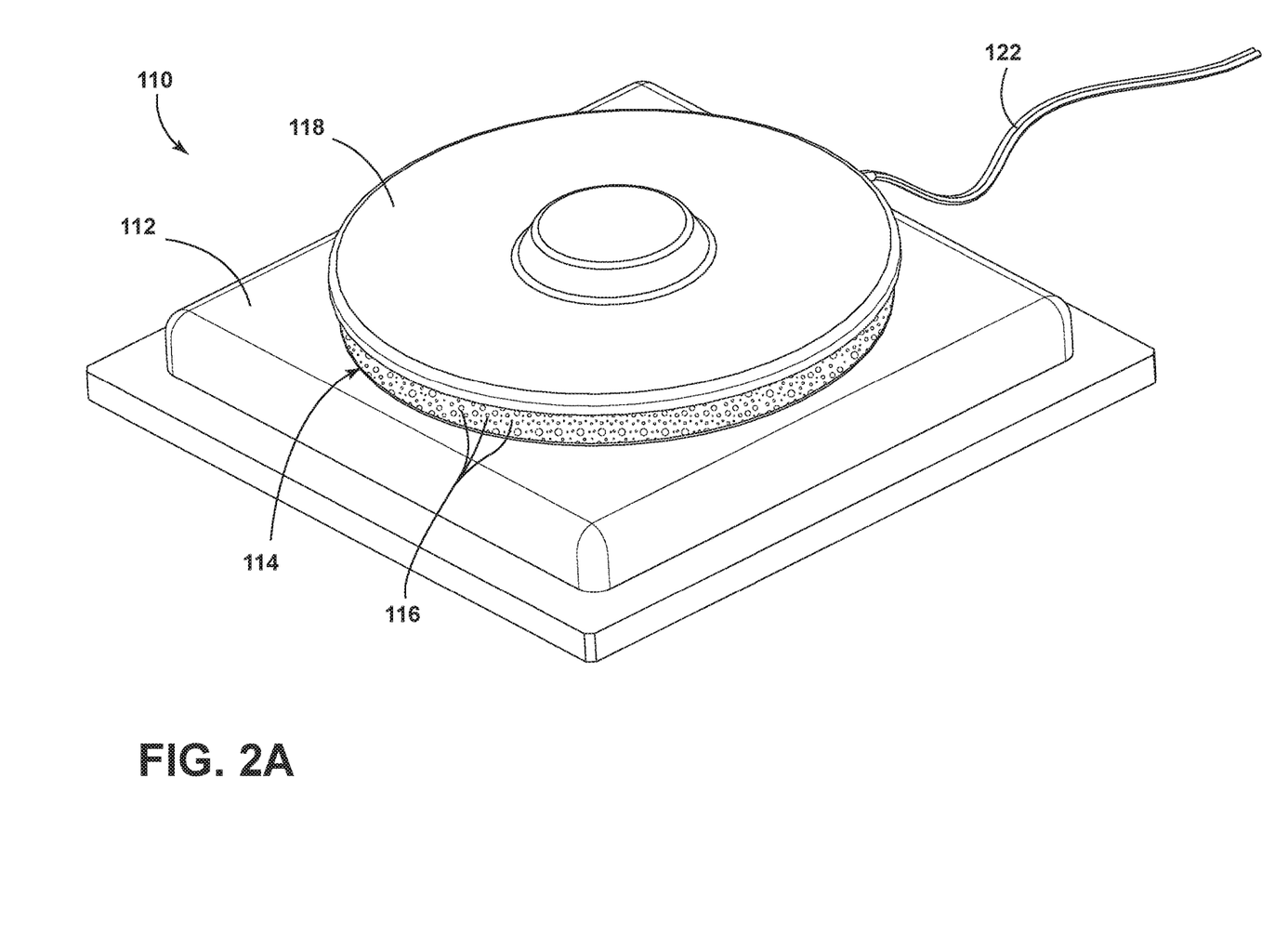
FIG. 2A is a perspective view of a heat transfer assembly per another embodiment of the invention.

FIG. 2A illustrates an alternative heat transfer assembly 110. The heat transfer assembly 110 is like the heat transfer assembly 10 previously described. Therefore, like parts will be identified with like numerals increased by 100, and it is understood that the description of like parts of the heat transfer assembly 10 applies to the heat transfer assembly 110, unless otherwise noted. One difference between them is that the heat transfer assembly 110 has been illustrated as including connections 122 for connecting the piezoelectric actuator 120 to a controllable electric source (not shown) so that an alternating voltage of the desired magnitude and frequency may be applied to the piezoelectric actuator 120.

Figure 2B:
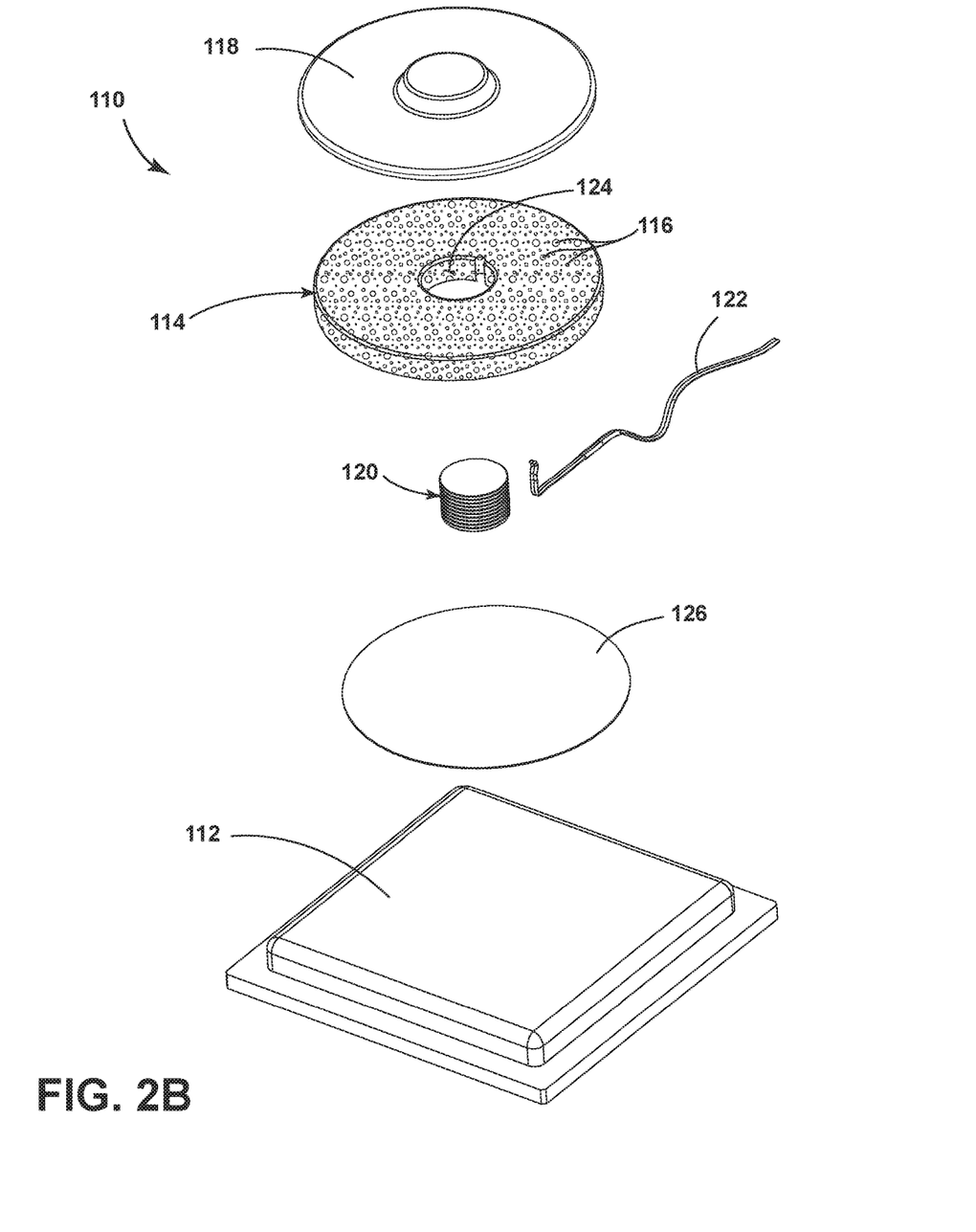
FIG. 2B is an exploded perspective view of the heat transfer assembly of FIG. 2A.

As better illustrated in FIG. 2B, the heat transfer assembly 110 has been illustrated as including a porous element 114 in the form of a ring having an open center 124.

Figure 2C:
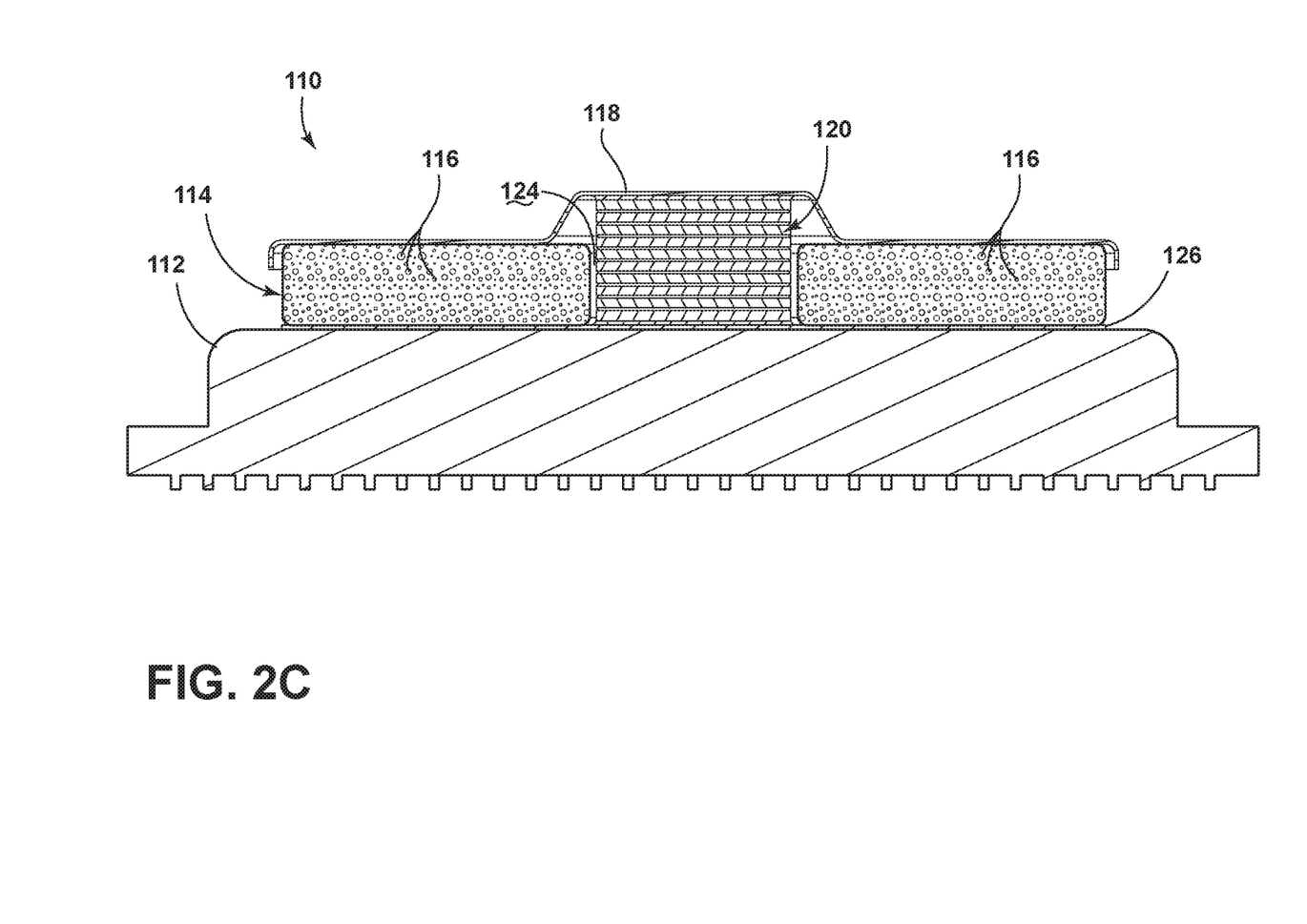
FIG. 2C is a cross-sectional view of the heat transfer assembly of FIG. 2A.

Further, the piezoelectric actuator 120 has been illustrated as being a multi element (stacked) actuator having a greater range of movement located within the center 124 as best illustrated in FIG. 2C. Another difference is that the piezoelectric actuator 120 has been provided on a lower side of the diaphragm 118. Yet another difference is that the porous element 114 may include a base 126, which may be connected to the heat generating electrical element 112 and may be used to connect the porous element 114 to the piezoelectric actuator 120. Any base 126 utilized may have a coefficient of thermal expansion that matches the heat generating electrical device 112 that is being cooled or may employ an adhesive that accommodates differential expansion or alternatively the heat transfer assembly 110 may be retained by a spring pressure mechanism.

As with the previous embodiment, the diaphragm 118 is arranged to forcibly fluctuate the volume of air entrained in the porous element 114 causing heat conducted from the heat generating electrical device 112 to dissipate in the surrounding atmosphere.

Figure 3A:
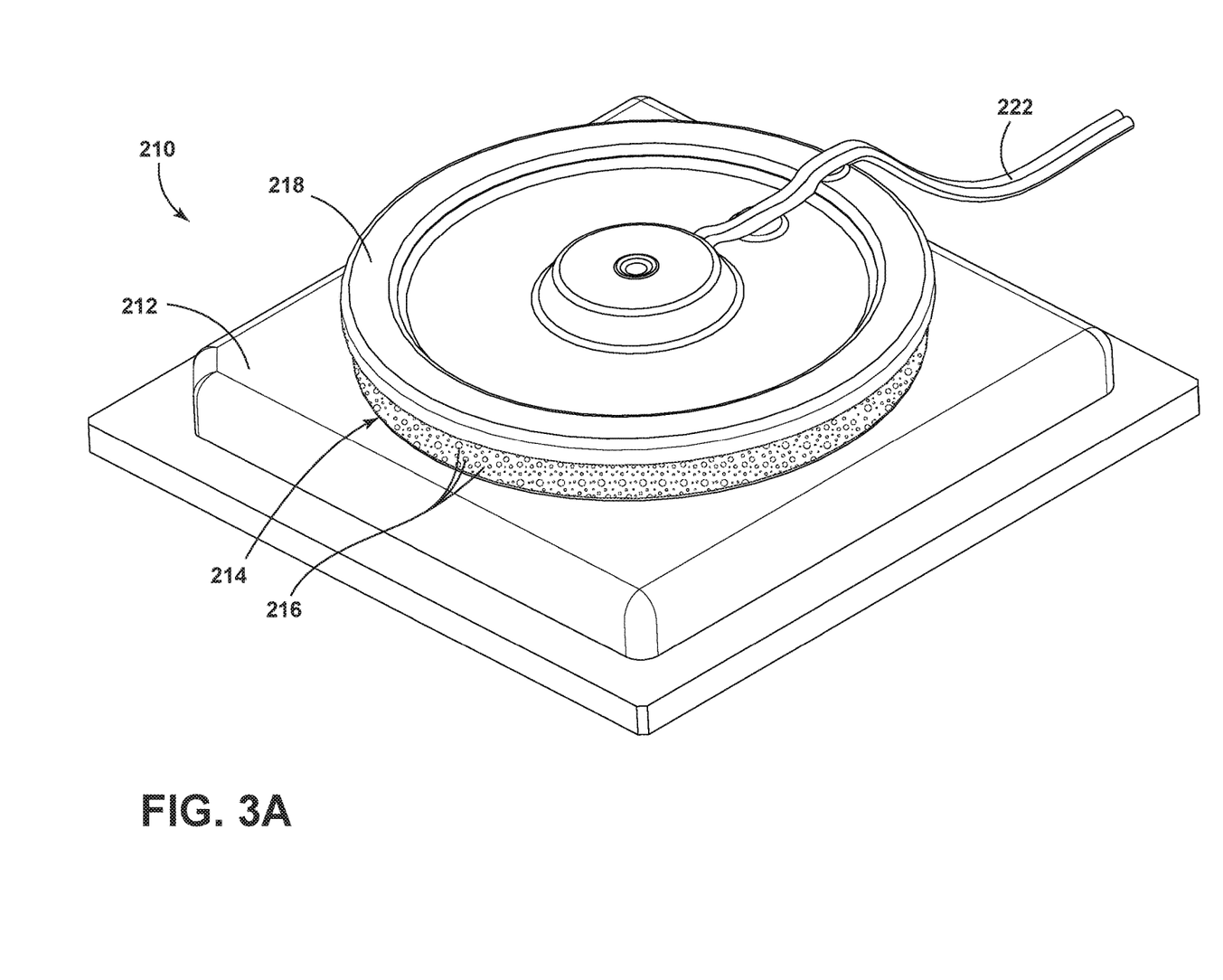
FIG. 3A is a perspective view of a heat transfer assembly per another embodiment of the invention.
Figure 3B:
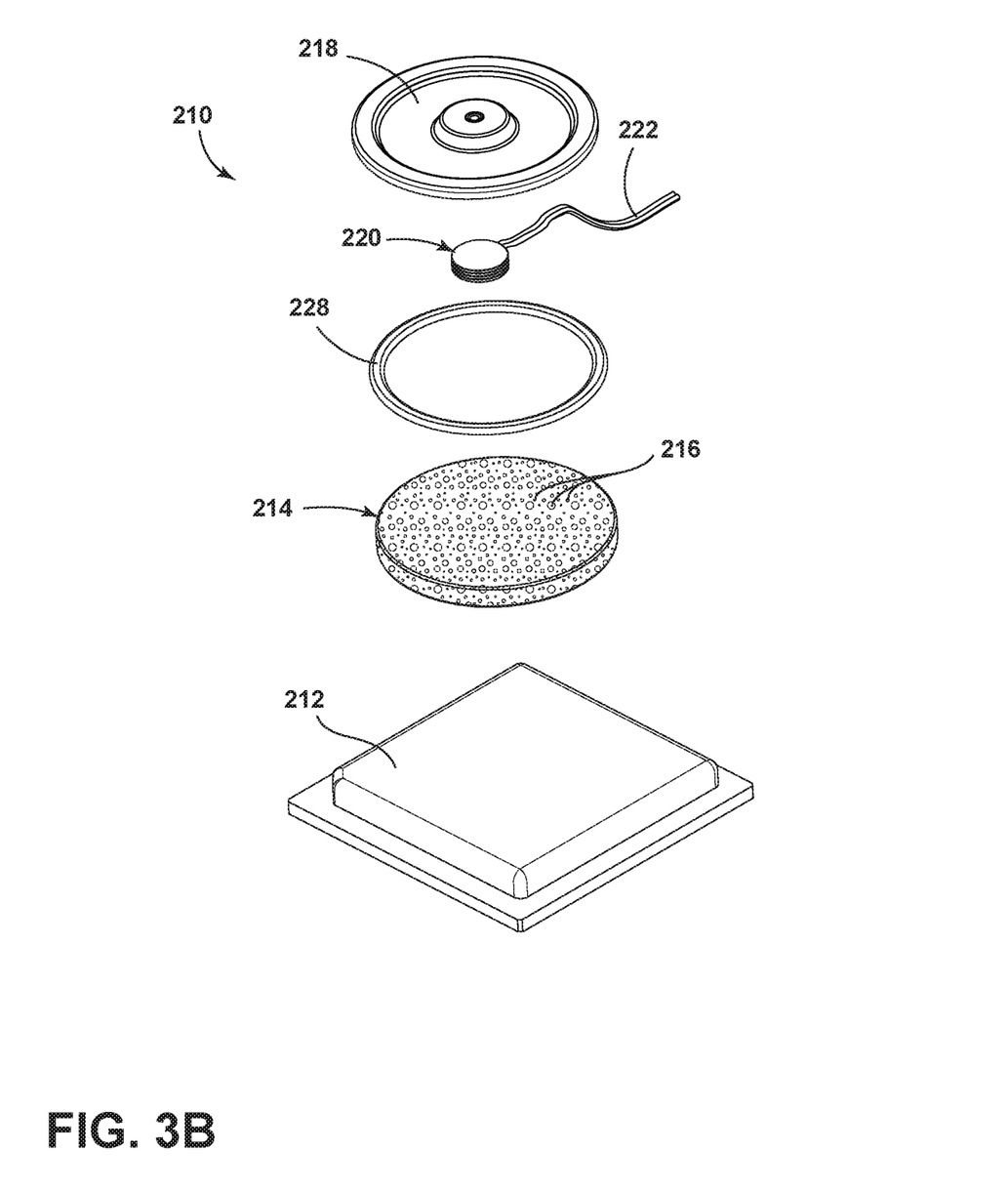
FIG. 3B is an exploded perspective view of the heat transfer assembly of FIG. 3A.
Figure 3C:
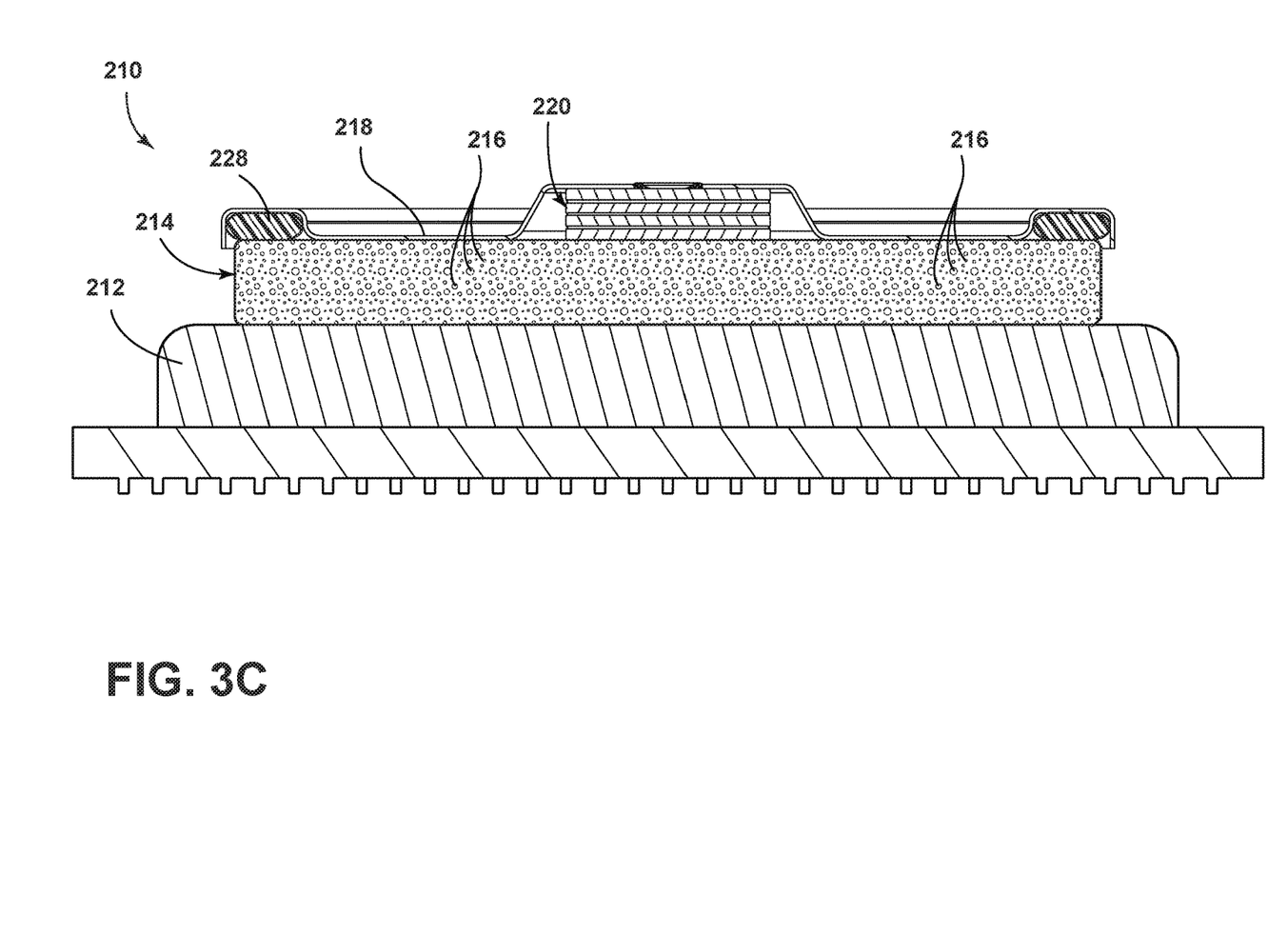
FIG. 3C is a cross-sectional view of the heat transfer assembly of FIG. 3A.

FIG. 3A illustrates an alternative heat transfer assembly 210. The heat transfer assembly 210 is like the heat transfer assembly 10 previously described. Therefore, like parts will be identified with like numerals increased by 200, and it is understood that the description of like parts of the heat transfer assembly 10 applies to the heat transfer assembly 210, unless otherwise noted. The heat transfer assembly 210 has also been illustrated as including connections 222. As seen more clearly in FIG. 3B, the piezoelectric actuator 220 is provided on a lower side of the diaphragm 218 and the connections 222 may pass through the diaphragm 218 such that they may be operably coupled to the piezoelectric actuator 220. It is also contemplated that the diaphragm 218 may be connected to the porous element 214. The diaphragm 218 may be connected to the porous element 214 in any suitable manner including that only a portion of the diaphragm 218 may be connected to the porous element 214. For example, it is more clearly shown in FIG. 3C that a periphery of the diaphragm 218 may be connected to the porous element 214 through use of an adhesive 228. Further, any suitable method of fastening may be used including the use of a fastener or brazing. The heat transfer assembly 210 may operate like the above embodiments.

Figure 4A:
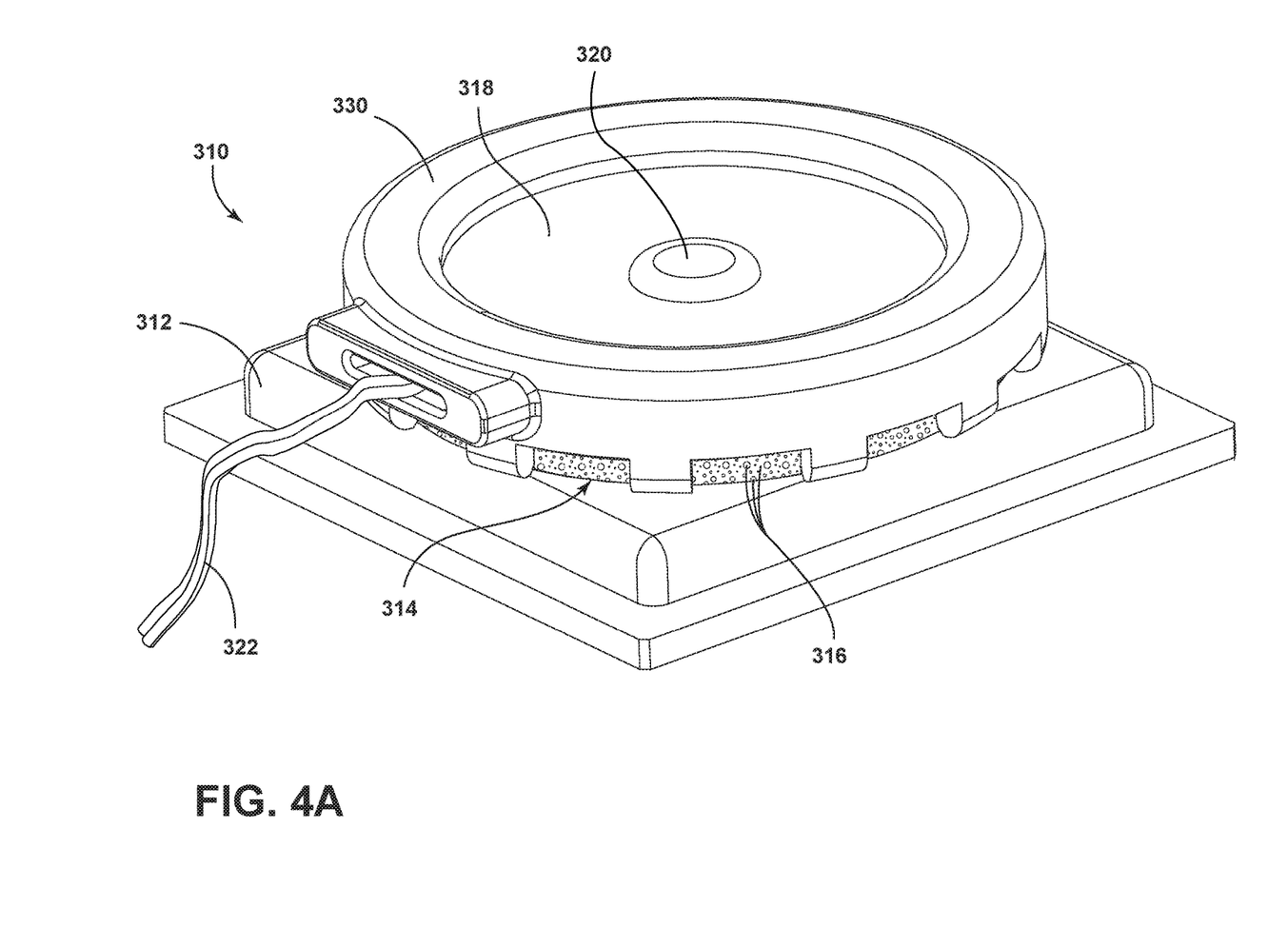
FIG. 4A is a perspective view of a heat transfer assembly per yet another embodiment of the invention.

FIG. 4A illustrates yet another alternative heat transfer assembly 310. The heat transfer assembly 310 is like the heat transfer assembly 10 previously described. Therefore, like parts will be identified with like numerals increased by 300, and it is understood that the description of like parts of the heat transfer assembly 10 applies to the heat transfer assembly 310, unless otherwise noted. One difference is that the diaphragm and piezoelectric actuator are integrally formed to define a piezoelectric diaphragm 318 configured to bend radially about its axis in opposing directions in response to electric signals. Thus, the piezoelectric diaphragm 318 is a single element arranged to perform as a diaphragm directly. The piezoelectric diaphragm 318 is flexibly retained by "0" rings 328 (FIG. 4C) within a rigid retaining ring 330. The rigid retaining ring 330 may be formed by any suitable means, which may include plastic molding. The lower "0" ring 328 placed between the porous element 314 and the piezoelectric diaphragm 318 may be used as a seal to prevent the escape of coolant. A sealing component 320 may be included to close the aperture commonly located in the center of the piezoelectric diaphragm 318.

Figure 4B:
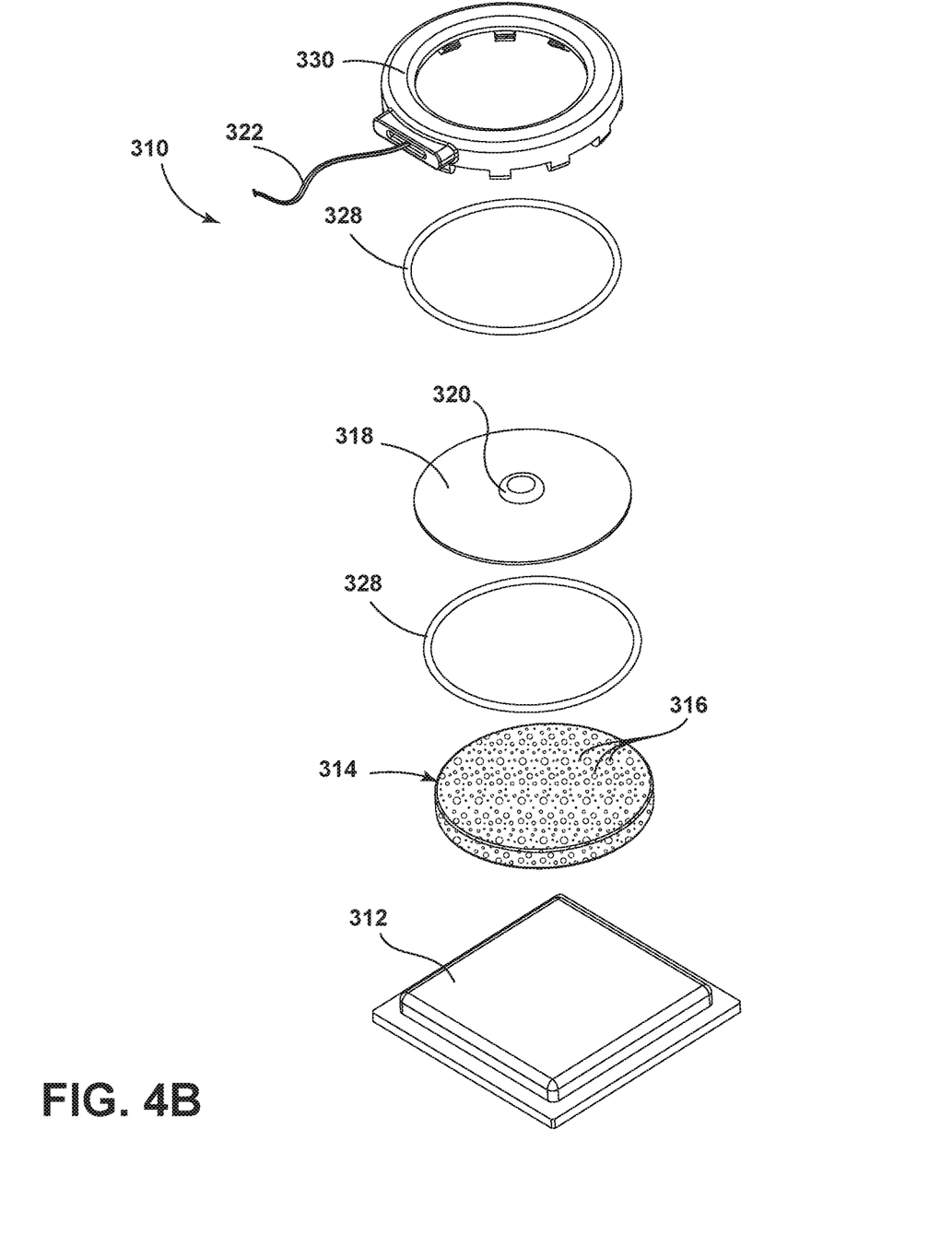
FIG. 4B is an exploded perspective view of the heat transfer assembly of FIG. 4A.
Figure 4C:
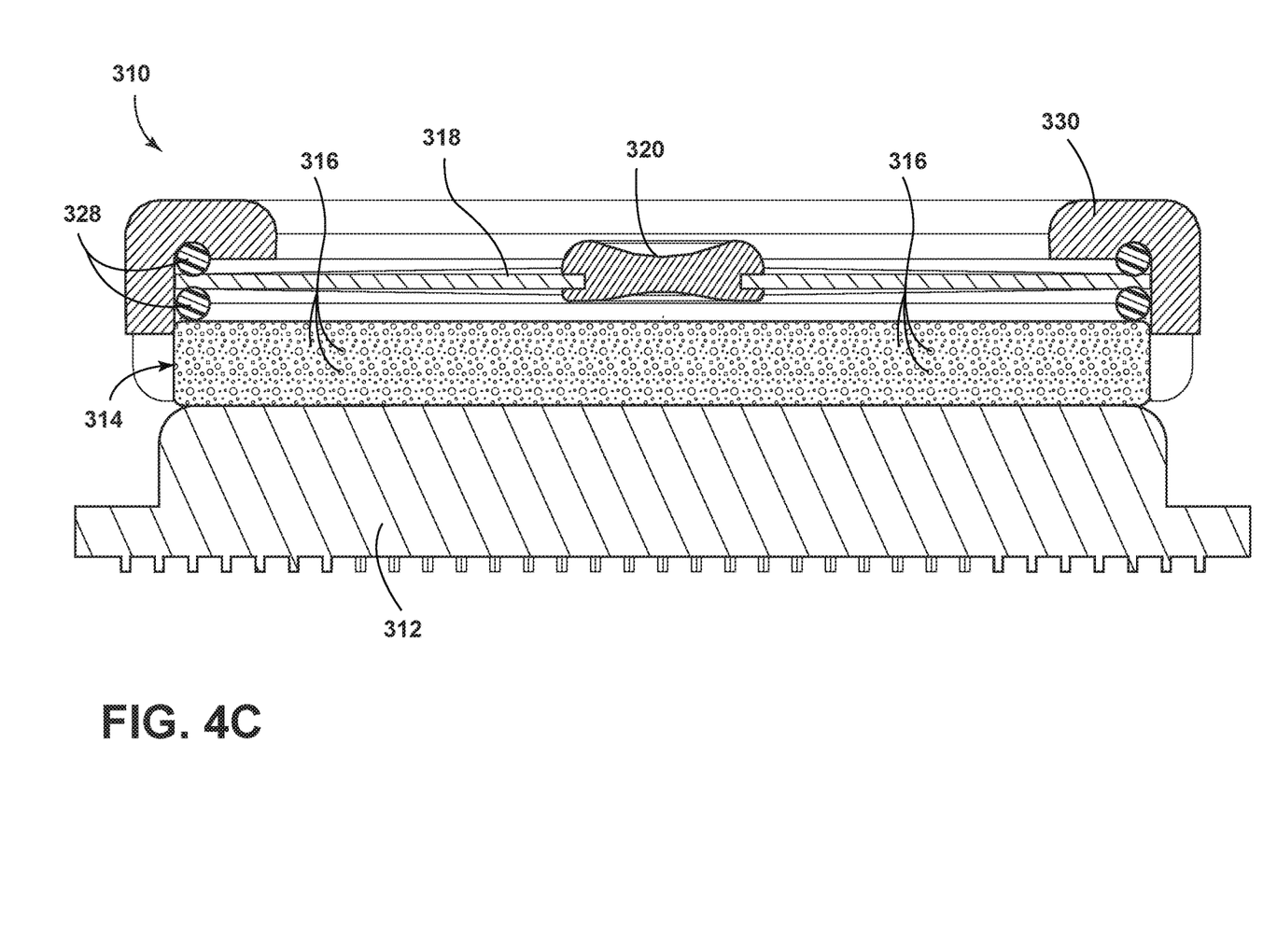
FIG. 4C is a cross-sectional view of the heat transfer assembly of FIG. 4A.

The retaining ring 330, illustrated more clearly in FIG. 4B, may be designed to incorporate an opening and strain relief for electrical connections to the periphery of the piezoelectric diaphragm. The heat transfer assembly 310 may operate like the above embodiments.

While the heat generating electrical elements have all been illustrated in a square configuration and the porous elements and diaphragms have all been illustrated in a circular configuration, it is understood that they may take alternative forms and shapes. Regardless of how the heat transfer assembly having the porous element and the diaphragm are formed, it will be understood that any suitable porous heat exchange material may be used in conjunction with diaphragm to alternately draw in fluid, transfer heat, and expel the fluid into the surrounding environment. By way of non-limiting example, the porous element of any of the embodiments of the invention may include a body with a cellular structure. For example, an open-cell foam may form the cellular structure. Any suitable thermally conductive material may be used for the porous element. Including that the porous element may have a thermal conductivity greater than 200 W/(mike) including that it may have a thermal conductivity greater than W/(mike).

Further still, it is contemplated that in any embodiments of the invention the porous element may be compressible. In such instances, the diaphragm may have a portion in contact with the porous element and during operation, when the diaphragm is in the extended position, the porous element is compressed, and when the diaphragm is in the retracted position, the porous element is uncompressed. The compressing of the porous element may aid in forcing cooling fluid out of the porous element and the uncompressing of the porous element may aid in drawing cooling fluid into the porous element.

The embodiments described above provide a variety of benefits including that the heat transfer assemblies solve the thermal management problem of cooling electronic devices with high power dissipations, including providing thermal management of electronic assemblies in avionic applications having hot spots, which may be created by high thermal density electrical components. Contemporary heat exchangers may require a supply of external forced air directed over extended surfaces attached to hot components and in some cases, it is not feasible to attach local extended surface and so heat pipes or other thermally conductive routes must be provided to transfer heat to a remote extended surface. Often it is impractical for an aircraft to supply the required airflow and electric fans must be incorporated into the equipment design. Such systems are relatively large, heavy, potentially expensive, and unreliable. In comparison, the above-described embodiments efficiently remove heat from high dissipation components and disperse it directly into the local environment. The above-described embodiments may be applied directly to the source of heat and require a minimum of external supporting hardware, including driver circuitry for the piezoelectric actuator. Further, the above-described embodiments may be activated electronically and may therefore be controlled by the electronic devices being cooled. The above-described embodiments are also small, lightweight, inexpensive, have a high thermal efficiency, and improved component reliability. The above-described embodiments allow for air movement through a high-density heat exchanger material operating in regenerative mode and use the heat exchanger and air mover in a manner whereby each can be optimized to achieve synergy with the other. Further, the above-described embodiments apply high density, high efficiency, commercial heat exchanger materials, normally restricted to liquid cooling, in an air-cooling environment.

To the extent not already described, the different features and structures of the various embodiments may be used in combination with each other as desired. Some features may not be illustrated in all the embodiments, but may be implemented if desired. Thus, the various features of the different embodiments may be mixed and matched as desired to form new embodiments, whether the new embodiments are expressly described. All combinations or permutations of features described herein are covered by this disclosure. It will also be understood that there are numerous possibilities for the design of the components including diaphragm to make optimum use of the small but rapid movements generated by the piezoelectric actuator. It is also contemplated that the diaphragm need not be separate from the porous element as it is contemplated that the external face of the porous element could be made closed-cell or sealed, to form an integral diaphragm made to oscillate by a directly attached piezoelectric actuator.

This written description uses examples to disclose the invention, including the best implementation, to enable any person skilled in the art to practice the invention, including making and using the devices or systems described and performing any incorporated methods presented. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A heat transfer assembly, comprising:
   a heat generating element;
   a thermally conductive porous element having a portion in thermally conductive contact with the heat generating element, the porous element being compressible;
   a diaphragm having a body portion adjacent the porous element and where the body portion is moveable between an extended position in contact with the porous element compressing the porous element to a first volume and a retracted position away from the porous element where the porous element is uncompressed to a second volume larger than the first volume, with the compressing of the porous elemnt aiding in forcing cooling fluid out of the porous element and uncompressing of the porous element aiding in drawing cooling fluid into the porous element; and
   wherein heat generated by the heat generating element is thermally conducted into the porous element, and wherein movement of the body portion away from the porous element draws cooling fluid into the porous element, whereby heat in the porous element is thermally conducted into the cooling fluid, and movement of the body portion towards the porous element forces cooling fluid out of the porous element.

2. The heat transfer assembly of claim 1, further comprising a piezoelectric actuator provided on the body portion of the diaphragm to move the body portion between the extended and retracted positions.

3. The heat transfer assembly of either of claim 1, wherein the porous element comprises a body with a cellular structure having at least 50% porosity.

4. The heat transfer assembly of claim 3, wherein the porous element comprises an open-cell foam forming the cellular structure.

5. The heat transfer assembly of claim 4, wherein the open-cell foam comprises a copper sponge.

6. The heat transfer assembly of claim 1, wherein the porous element has a thermal conductivity greater than 200 W/(m·K).

7. The heat transfer assembly of claim 6, wherein the porous element has a thermal conductivity greater than 401 W/(m·K).

8. The heat transfer assembly of claim 1, wherein the body portion is connected to the porous element.

9. The heat transfer assembly of claim 1, wherein the porous element is connected to the heat generating element.

10. A heat transfer assembly, comprising:
a thermally conductive porous element having a portion configured to contact a heat generating element, the porous element having a porosity of at least 50% open volume to total volume of the porous element and the porous element being compressible;
a diaphragm having a body portion adjacent to the porous element and covering an entire surface of the porous element, and where the body portion is moveable between an extended position towards the porous element and a retracted position away from the porous element; and
a piezoelectric actuator provided on the body portion to move the body portion between extended and retracted positions;
wherein the body portion selectively has a portion in contact with the porous element and when the body portion is in the extended position, the porous element is compressed, and when the body portion is in the retracted position, the porous element is uncompressed, movement of the body portion away from the porous element draws cooling fluid into the porous element, whereby heat in the porous element is thermally conducted into the cooling fluid, and movement of the body portion towards the porous element forces cooling fluid out of the porous element and the compressing of the porous element aiding in forcing cooling fluid out of the porous element and the uncompressing of the porous element aiding in drawing cooling fliud into the porous element.

11. The heat transfer assembly of claim 10, wherein the porous element comprises a copper sponge.

12. The heat transfer assembly of claim 10, wherein the body portion and piezoelectric actuator are integrally formed to define a piezoelectric diaphragm configured to bend radially about its axis in opposing directions in response to electric signals.

13. A heat transfer assembly comprising:
a porous element having a portion configured to contact a heat generating element, the porous element being compressible and having a proposity of at least 50% open volume to total volume of the porous element;
a diaphragm having a body portion covering a surface of the porous element wherein the body portion is moveable between an extended position in contact with the porous element and a retracted position away from the porous element when the body portion is in the extended position, the porous element is compressed to a first volume, and when the body portion is in the retracted position, the porous element is uncompressed to a second volume larger than the first volume; and
an actuator provided on the body portion to move the body portion between extended and retracted positions;
wherein the retraction of the body portion draws cooling fluid into the porous element and movement of the body portion towards the porous element forces cooling fluid out of the porous element, and wherein a proportion of area of the porous element covered by the body portion is larger than the area available to draw cooling fluid into the porous element with the compressing of the porous element aiding in forcing cooling fluid out of the porous element and the uncompressing of the porous element aiding in drawing cooling fluid into the porous element.

14. The heat transfer assembly of claim 13, wherein the actuator is a piezoelectric actuator.

15. The heat transfer assembly of claim 14, wherein the body portion and the piezoelectric actuator are integrally formed to define a piezoelectric diaphragm configured to bend radially about its axis in opposing directions in response to electric signals.

16. The heat transfer assembly of claim 1 wherein the diaphragm is configured such that the porous element has a proportion of area covered by the diaphragm that is larger than the area available to draw cooling fluid into the porous element.

* * * * *